(12) United States Patent
Balakrishnan et al.

(10) Patent No.: US 9,570,356 B1
(45) Date of Patent: Feb. 14, 2017

(54) MULTIPLE GATE LENGTH VERTICAL FIELD-EFFECT-TRANSISTORS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/961,179

(22) Filed: Dec. 7, 2015

(51) Int. Cl.
| | | |
|---|---|---|
| H01L 29/772 | (2006.01) | |
| H01L 27/085 | (2006.01) | |
| H01L 21/82 | (2006.01) | |
| H01L 21/8234 | (2006.01) | |
| H01L 29/66 | (2006.01) | |
| H01L 29/78 | (2006.01) | |
| H01L 29/417 | (2006.01) | |
| H01L 29/423 | (2006.01) | |
| H01L 27/088 | (2006.01) | |
| H01L 21/308 | (2006.01) | |
| H01L 21/283 | (2006.01) | |

(52) U.S. Cl.
CPC ..... H01L 21/823487 (2013.01); H01L 21/283 (2013.01); H01L 21/3081 (2013.01); H01L 21/823437 (2013.01); H01L 21/823456 (2013.01); H01L 27/088 (2013.01); H01L 29/41741 (2013.01); H01L 29/42356 (2013.01); H01L 29/6656 (2013.01); H01L 29/66545 (2013.01); H01L 29/66666 (2013.01); H01L 29/7827 (2013.01)

(58) Field of Classification Search
None
See application file for complete search history.

(56) References Cited

U.S. PATENT DOCUMENTS

| | | | |
|---|---|---|---|
| 2009/0303371 A1* | 12/2009 | Watanabe | H01L 27/14603 348/311 |
| 2010/0052034 A1* | 3/2010 | Cheng | H01L 29/7881 257/316 |
| 2010/0075447 A1* | 3/2010 | Lee | H01L 51/003 438/23 |

* cited by examiner

*Primary Examiner* — Johannes P Mondt
(74) *Attorney, Agent, or Firm* — Fleit Gibbons Gutman Bongini Bianco PL; Thomas S. Grzesik

(57) ABSTRACT

Various embodiments disclose a method for fabricating a semiconductor structure. In one embodiment, the method includes forming a masking layer over at least a first portion of a source contact layer formed on a substrate. At least a second portion of the source contact layer is recessed below the first portion of the source contact layer. The mask layer is removed and a first spacer layer, a replacement gate on the first spacer layer, a second spacer layer on the replacement gate, and an insulating layer on the second spacer layer are formed. First and second trenches are then formed. A first channel layer is epitaxially grown within the first trench. A second channel layer is epitaxially grown within the second trench. A length of the second channel layer is greater than a length of the first channel layer.

12 Claims, 19 Drawing Sheets

MULTIPLE GATE LENGTH VERTICAL FIELD-EFFECT-TRANSISTORS

BACKGROUND OF THE INVENTION

The present disclosure generally relates to the field of semiconductors, and more particularly relates to vertical field-effect-transistors.

Vertical transistors are a promising option for technology scaling for 5 nm and beyond. Multiple gate length devices are important so power/performance tradeoff can be tuned in circuit design. However, achieving multiple gate lengths for a vertical field-effect-transistor is challenging due to the topography it creates.

SUMMARY OF THE INVENTION

In one embodiment, a method for fabricating a semiconductor structure including a plurality of vertical transistors each having gate lengths is disclosed. The method comprises forming a masking layer over at least a first portion of a source contact layer formed on a substrate. At least a second portion of the source contact layer is recessed below the first portion of the source contact layer. The mask layer is removed and a first spacer layer, a replacement gate on the first spacer layer, a second spacer layer on the replacement gate, and an insulating layer on the second spacer layer are formed on the first and second portions of the source contact layer. A first trench extending from a top surface of the insulating layer down to a top surface of the first portion of the source contact layer is then formed. A second trench extending from the top surface of the insulating layer down to a top surface of the second portion of the source contact layer is formed. A first channel layer is epitaxially grown within the first trench from the first portion of the source contact layer. A second channel layer is epitaxially grown within the second trench from the second portion of the source contact layer. A length of the second channel layer is greater than a length of the first channel layer.

In another embodiment, a semiconductor structure is disclosed. The semiconductor structure comprises a first vertical field-effect transistor formed on a substrate. The first vertical field-effect transistor comprises a first gate length. The semiconductor structure further comprises at least a second vertical field-effect transistor formed on the substrate. The second vertical field-effect transistor comprises a second gate length that is different from the first gate length of the first vertical field-effect transistor.

In yet another embodiment, an integrated circuit is disclosed. The integrated circuit comprises a semiconductor structure. The semiconductor structure comprises a first vertical field-effect transistor formed on a substrate. The first vertical field-effect transistor comprises a first gate length. The semiconductor structure further comprises at least a second vertical field-effect transistor formed on the substrate. The second vertical field-effect transistor comprises a second gate length that is different from the first gate length of the first vertical field-effect transistor.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
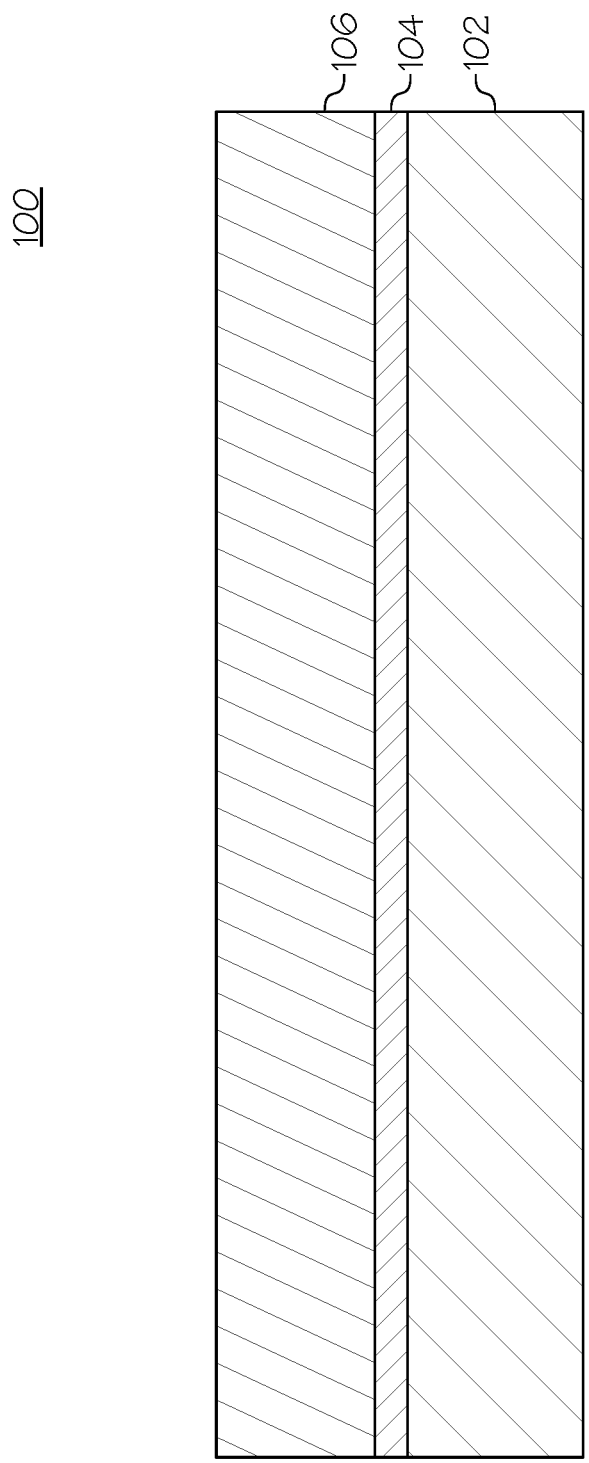
FIG. 1 is a cross-sectional view of an initial semiconductor structure according to one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-18 illustrate various processes for fabricating vertical field-effect-transistors (FETs) comprising multiple gate lengths. FIG. 1 shows a partially fabricated semiconductor device 100 comprising a substrate 102, a counter-doped layer 104, and a (doped) source contact layer 106. The thickness of the substrate 102 can be, for example, from 50 microns to 1,000 microns, although lesser and greater thicknesses can be employed as well. The substrate 102 can be single crystalline and or a bulk substrate, a semiconductor-on-insulator (SOI) substrate, or a hybrid substrate. An insulator layer (not shown) comprising a dielectric material such as silicon oxide, silicon nitride, silicon oxynitride, or any combination thereof can be formed on an in contact with the substrate 102.

The substrate 102 can be appropriately doped either with p-type dopant atoms or with n-type dopant atoms, or the material can be substantially undoped (intrinsic). The dopant concentration of the substrate 102 can be from $1.0 \times 10^{15}/cm^3$ to $1.0 \times 10^{19}/cm^3$, and in one embodiment, is from $1.0 \times 10^{16}$ $cm^3$ to $3.0 \times 10^{18}/cm^3$, although lesser and greater dopant concentrations are applicable as well. The counter-doped layer 104 is formed on an in contact with the substrate 102 (or a buried insulator layer if formed). The counter-doped layer 104 is formed by an epitaxial growth of a semiconductor material. The counter-doped layer can then be implanted with dopants and annealed using, for example, rapid thermal anneal. Alternatively, the counter-doped layer can be doped in-situ during the epitaxial growth. The purpose of the counter-doped layer is to provide an isolation between one transistor and the next transistor. The source contact layer 106 is formed on and in contact with the counter-doped layer 104. The source contact 106 can be, for example, an n++ doped region of the substrate 102 and can have a thickness in a range of, for example, about 10 nm to about 200 nm. However, other thicknesses are applicable as well. The source contact region can be formed by epitaxial growth.

Figure 2:
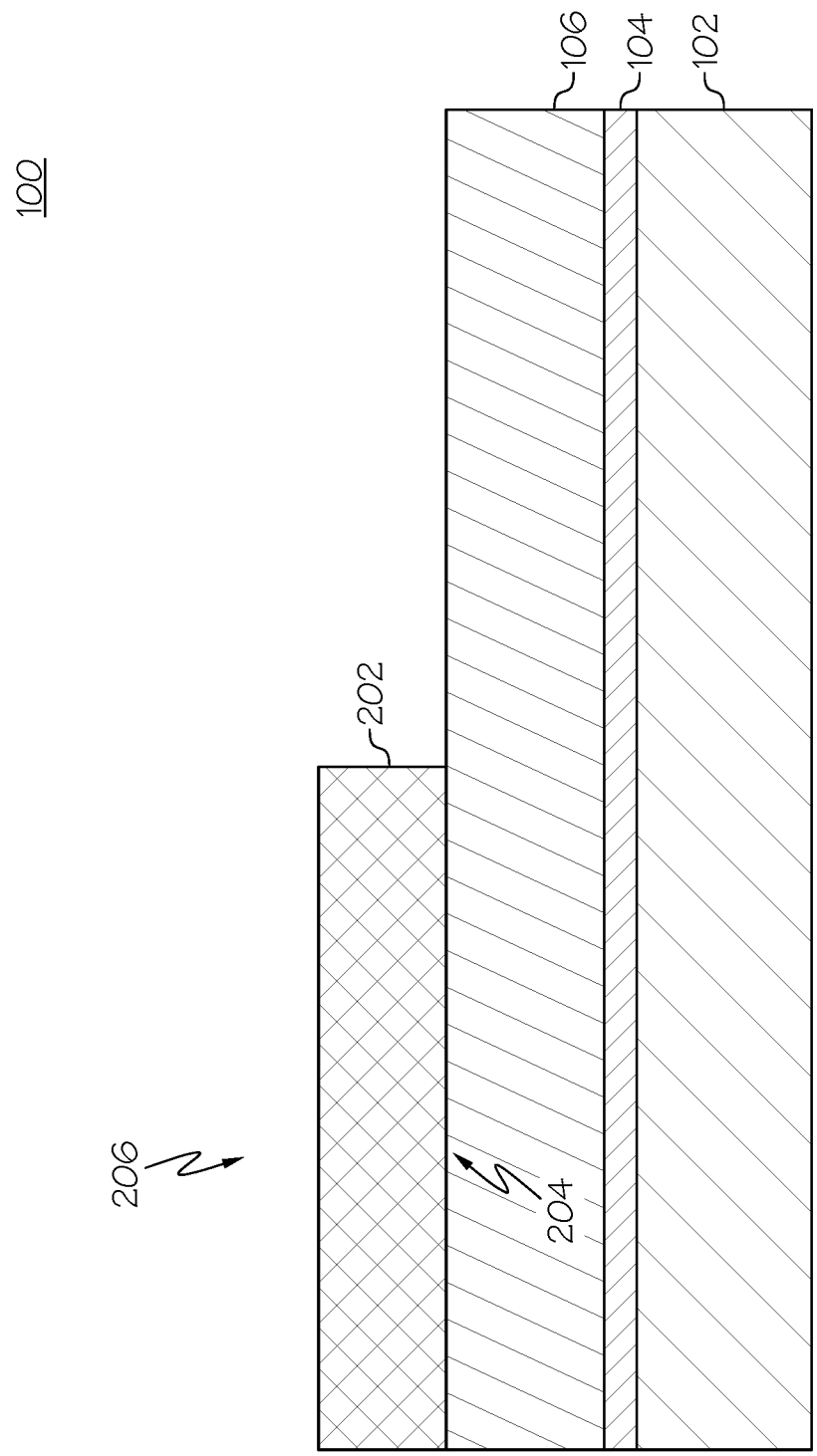
FIG. 2 is a cross-sectional view of the semiconductor structure after a masking layer has been formed over a first portion of a source contact layer according to one embodiment of the present disclosure.
Figure 3:
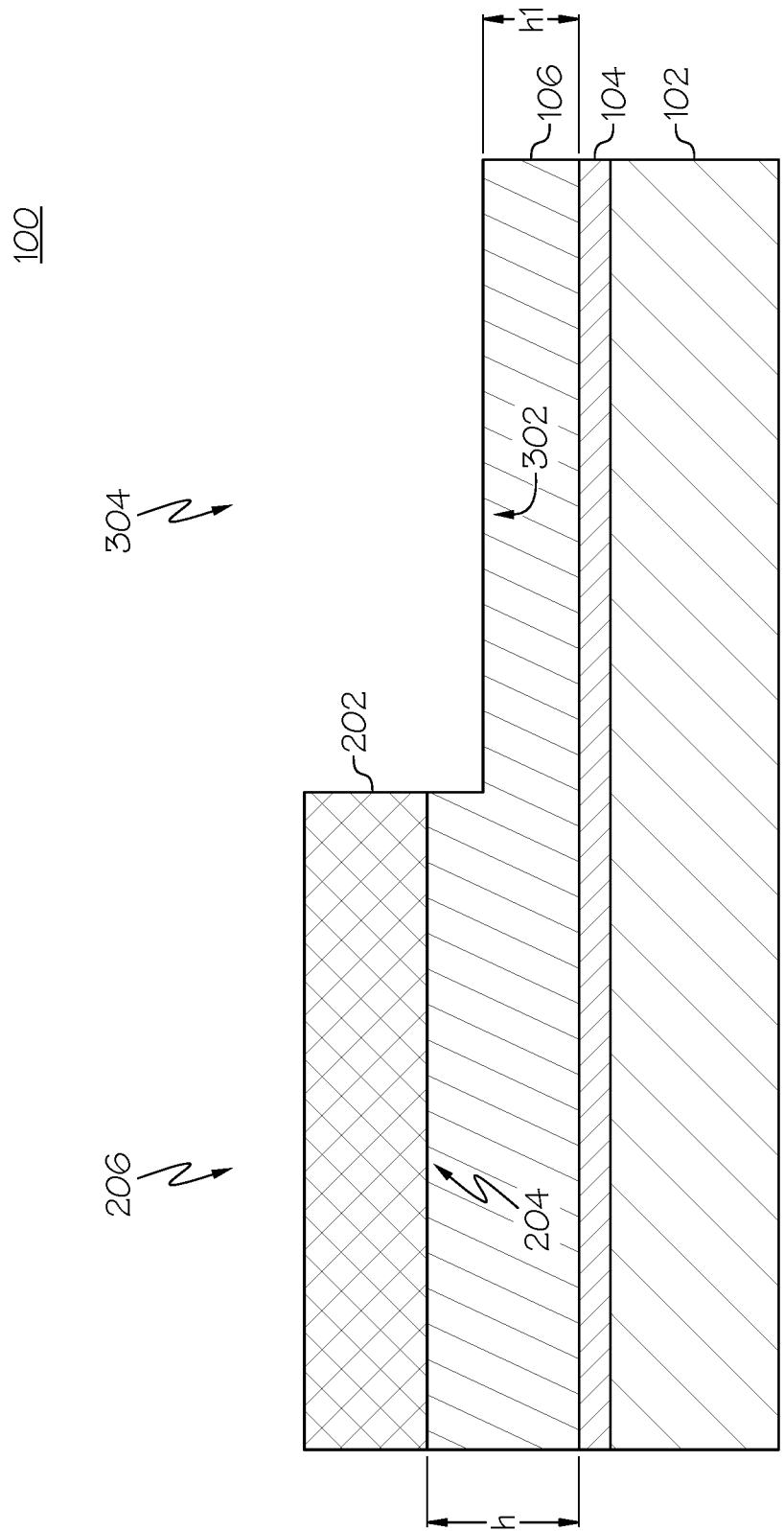
FIG. 3 is a cross-sectional view of the semiconductor structure after a second portion of source contact layer has been recessed according to one embodiment of the present disclosure.

FIG. 2 shows that a masking material is deposited and patterned to form a mask layer 202 over at least a first portion 204 of the source contact layer 106 in a first region 206 of the structure 100. An etching process such as RIE or a wet etch is then performed to recess at least a second portion 302 of the source contact layer 106 in a second region 304 of the structure 100, as shown in FIG. 3. The first portion 206 of the source contact layer 106 is not recessed since it is protected by the mask layer 202 during the etching processes. As a result of the etching process, the first portion 204 of the source contact layer 106 comprises a height h that is greater than a height h' of the second portion 302 of the source contact layer 106. The height difference between h and h' can be, for example, 2 nm to 10 nmm, but is not limited to such dimensions. In one embodiment, the portions of the source contact layer 106 that are unmasked are recessed according to a desired gate length of a device to be formed on the recessed portion.

Figure 4:
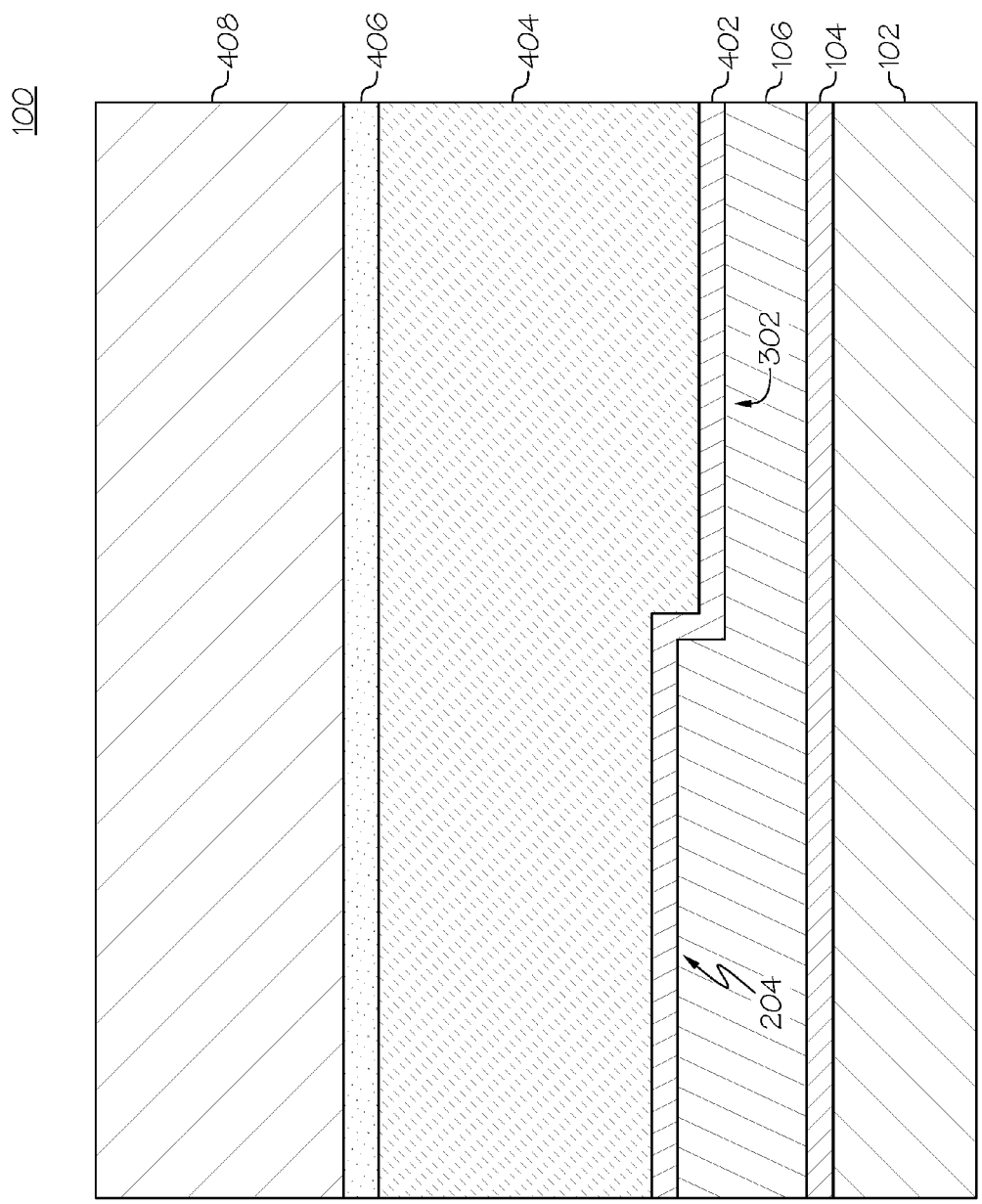
FIG. 4 is a cross-sectional view of the semiconductor structure after the masking layer has been removed and a first spacer layer, replacement gate, second spacer layer, and an insulating layer have been formed therein according to one embodiment of the present disclosure.

After the second portion(s) of the source contact layer 106 has been recessed, the masking layer(s) 202 is removed via a selective etching process. A first (bottom) spacer layer 402, a replacement (dummy) gate 404, a second (top) spacer layer 406, and an dielectric capping layer 408 are then formed on the structure 100, as shown in FIG. 4. The first spacer 402 is formed on and in contact with the first and second portions 204, 302 of the source contact layer 106. The first spacer layer 402 comprises a dielectric material (such as silicon oxide, silicon nitride, silicon oxynitride, or a combination of these) and can be formed using any conventional deposition process such as, for example, chemical vapor deposition (CVD).

The replacement gate 404 is formed on and in contact with the first spacer 402 and comprises a single layer or multiple layers of oxide, polysilicon, amorphous silicon, nitride, or a combination thereof. The replacement gate 404 can be formed by CVD processes, thermal oxidation, or wet chemical oxidation. When the replacement gate 404 is initially formed, the portion of the replacement gate 404 formed over the second portion 302 of the source contact layer 106 comprises at least a top surface that is lower than at least a top surface of the portion of the replacement gate 404 formed over the first portion 204 of the source contact layer 106. A planarization process is performed to planarize a top portion of the replacement gate 404. For example, FIG. 4 shows the portions of the top surface of the replacement gate 404 within the regions where the channel lengths will be different as being co-planar. This replacement gate stack 404 acts as a place holder for the actual gate stack to be formed after formation of the channel material for the device(s).

The second spacer 406 is formed on and in contact with the replacement gate 404. The second spacer 406 comprises a dielectric material (such as silicon oxide, silicon nitride, silicon oxynitride, or a combination of these) and can be formed using any conventional deposition process such as, for example, CVD. The first and second spacer layers 402, 406 can comprise the same or different materials. The dielectric capping layer 408 is formed on and in contact with the second spacer layer 406 and comprises, for example, silicon dioxide. The dielectric capping layer is a sacrificial layer and comprises a different dielectric material than the top spacer dielectric. The purpose of the dielectric capping layer 408 is to enable further processing.

Figure 5:
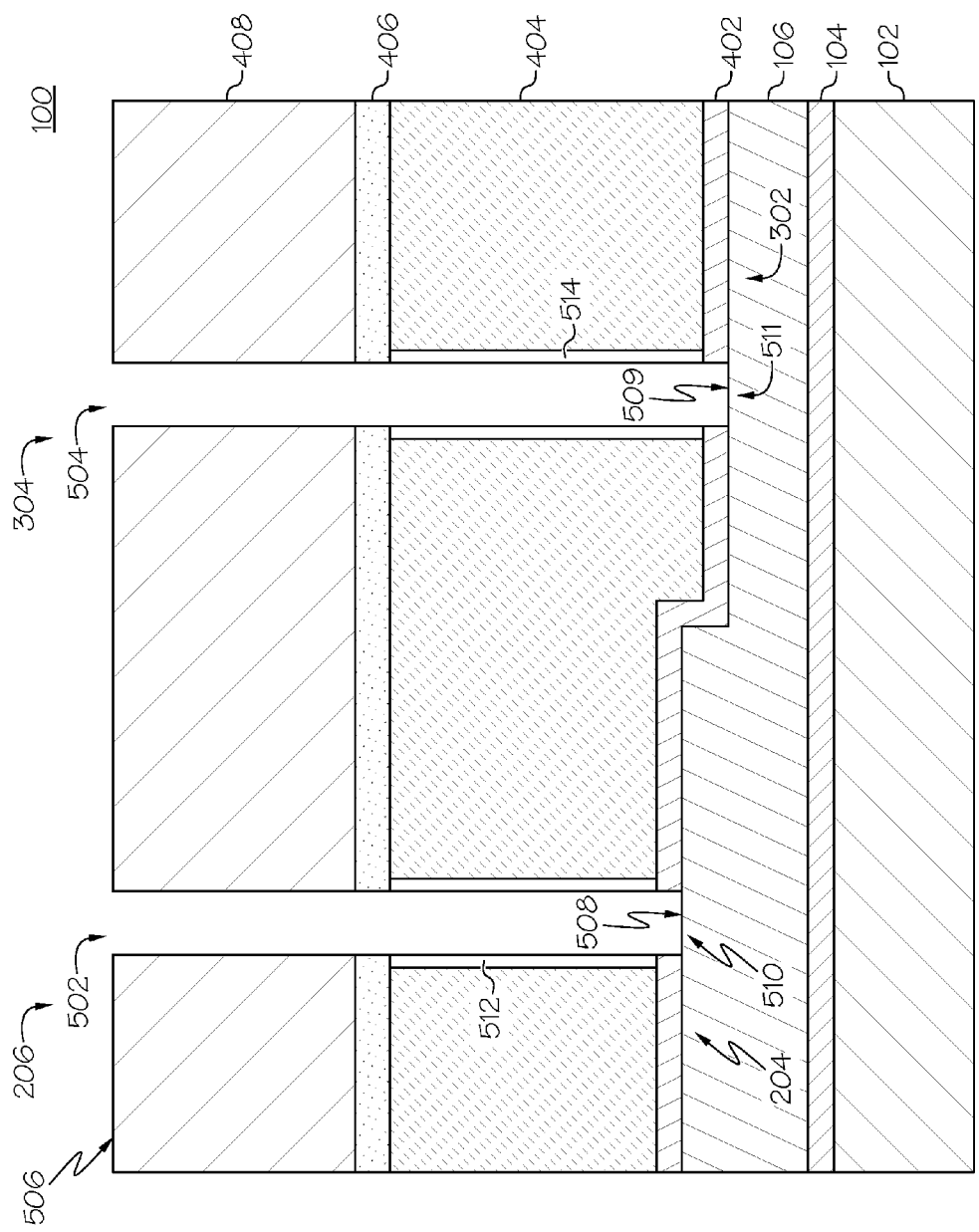
FIG. 5 is a cross-sectional view of the semiconductor structure after a first trench and a second trench have been formed in a first region and a second region, respectively, of the semiconductor structure according to one embodiment of the present disclosure.

FIG. 5 shows that multiple etching processes are performed to form a first opening/trench 502 within the first region 206 of the structure 100 and at least a second opening/trench 504 within the second region 304 of the structure 100. For example, masking layers (not shown) can be formed and patterned to define the areas where the trenches 502, 504 are to be formed. Then, a first etching process is performed to remove a portions of the dielectric capping layer 408 selective to the material of the second spacer layer 406. A second etching process is then performed to remove portions of the second spacer layer 406, which underlie the portion of the trenches 502, 504 formed from the first etching process, selective to the material of the replacement gate 404. A third etching process is then performed to remove portions of the replacement gate 404, which underlie the portion of the trenches 502, 504 formed from the second etching process, selective to the material of the first spacer layer 402. A fourth etching process is then performed to remove portions of the first spacer layer 402, which underlie the portion of the trenches 502, 504 formed from the third etching process, selective to the material of the source contact layer 106. The resulting trenches 502, 504 extend through a top surface 506 of the dielectric capping layer 408 down to a top surface 508, 509 of an exposed portion 510, 511 of the source contact layer 106. This creates a self-aligned junction because a source extension can be epitaxially grown from the source layer 106 to a top surface of the first spacer layer 402. The length/height h of the second trench 504 is greater than a length/height h' of the first trench 502 since the portion 302 of the source layer 106 underlying the second trench 504 is recessed with respect to the portion 204 of the source layer 106 underlying the first trench 502.

Figure 6:
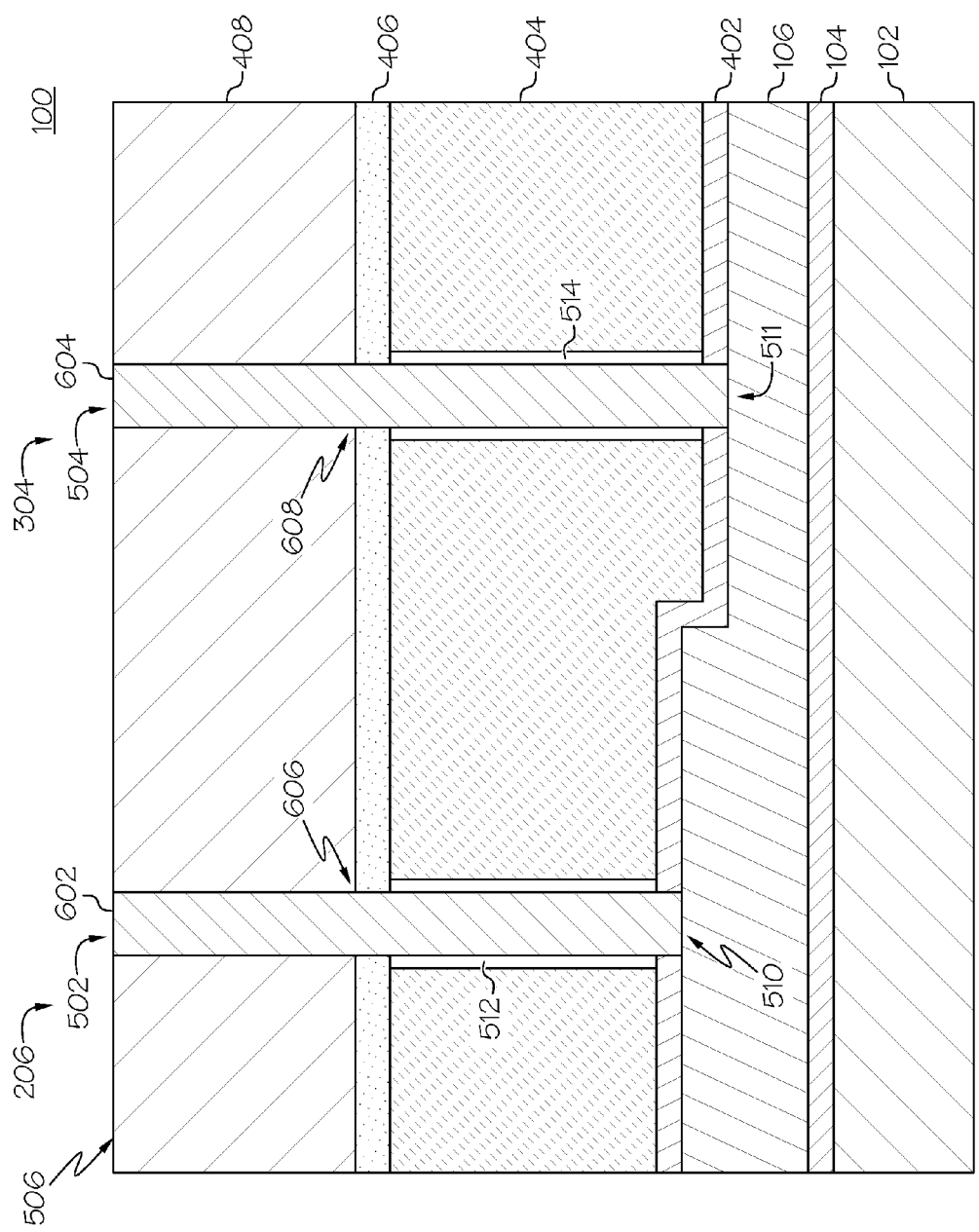
FIG. 6 is a cross-sectional view of the semiconductor structure after a first channel layer and a second channel layer have been epitaxially grown within the first and second trenches, respectively, accordingly to one embodiment of the present disclosure.

FIG. 5 also shows that a protective layer 512, 514 is formed on exposed sidewalls of the replacement gate 404 within each of the first and second trenches 502, 504. A plasma oxidation or other type oxidation process can be performed to form the protective layers 512, 514. An epitaxy process is then performed to grow a material 602, 604 within the trenches 502, 504 forming a first and second channel 606, 608, respectively, as shown in FIG. 6. For example, the epitaxy process grows the material 602, 604 up from the portions 510, 511 of the source contact layer 106 exposed in the trenches 502, 504 above the top surface 506 of the dielectric capping layer 408.

In one embodiment, the epitaxy process grows the materials 602, 604 utilizing the same doping concentration. For example, for nFET devices, the channels 606, 608 can comprise, for example, $1e^{16}$-$1e^{17}$ $cm^{-2}$ phosphorous doped silicon, $1e^{17}$-$1e^{18}$ $cm^{-2}$ phosphorous doped silicon, and/or the like. For pFET devices, the channels 606, 608 can comprise, for example, $1e^{17}$ $cm^{-2}$ boron doped $SiGe_{0.20}$, $1e^{17}$ $cm^{-2}$ boron doped $SiGe_{0.30}$, and/or the like. It should be noted that these materials (e.g., Ge, III-V materials, etc.) and doping concentrations are only illustrative and other materials and concentrations are applicable as well. In another embodiment, each of the materials 602, 604 are grown with different doping concentrations. For example, if the first channel 606 was formed utilizing $1e^{16}$-$1e^{17}$ $cm^{-2}$ phosphorous doped silicon the second channel 608 can be formed utilizing $1e^{17}$-$1e^{18}$ $cm^{-2}$ phosphorous doped silicon. In another example, if the first channel 606 was formed utilizing $1e^{17}$ $cm^{-2}$ boron doped $SiGe_{0.20}$ the second channel 608 can be formed utilizing $1e^{17}$ $cm^{-2}$ boron doped $SiGe_{0.30}$. The channel material and doping concentrations can be selected based on the desired threshold voltage of the device.

Figure 7:
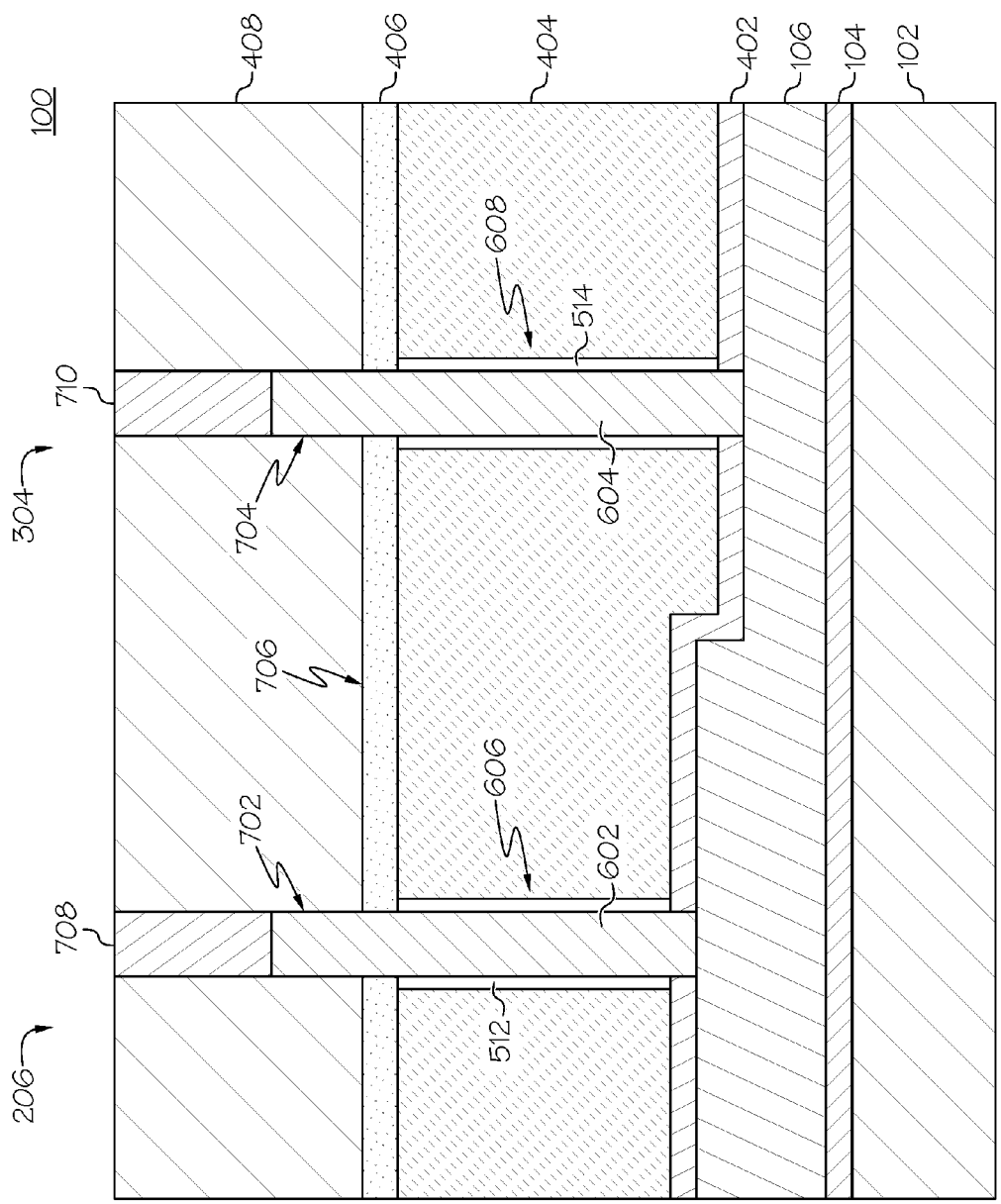
FIG. 7 is a cross-sectional view of the semiconductor structure after the first and second channel layers have been recessed and a mask formed thereon according to one embodiment of the present disclosure.

Once the channels 606, 608 have been formed, any overgrowth of channel materials 602, 604 are removed by, for example, a chemical-mechanical polishing (CMP) process that stops on the dielectric capping layer 408. FIG. 7 shows a portion of the first and second channels 606, 608 being partially recessed via an etching process. In this embodiment, the channels 606, 608 are partially recessed so that a portion 702, 704 (e.g., 15-50 nm) of each channel 606, 608 remains above a top surface 706 of the second spacer layer 406. A masking material such as nitride is then deposited and polished back (stopping on the dielectric capping layer 408) to form a mask layer 708, 710 on and in contact with a top surface 712, 714 of the channels 606, 608.

Figure 8:
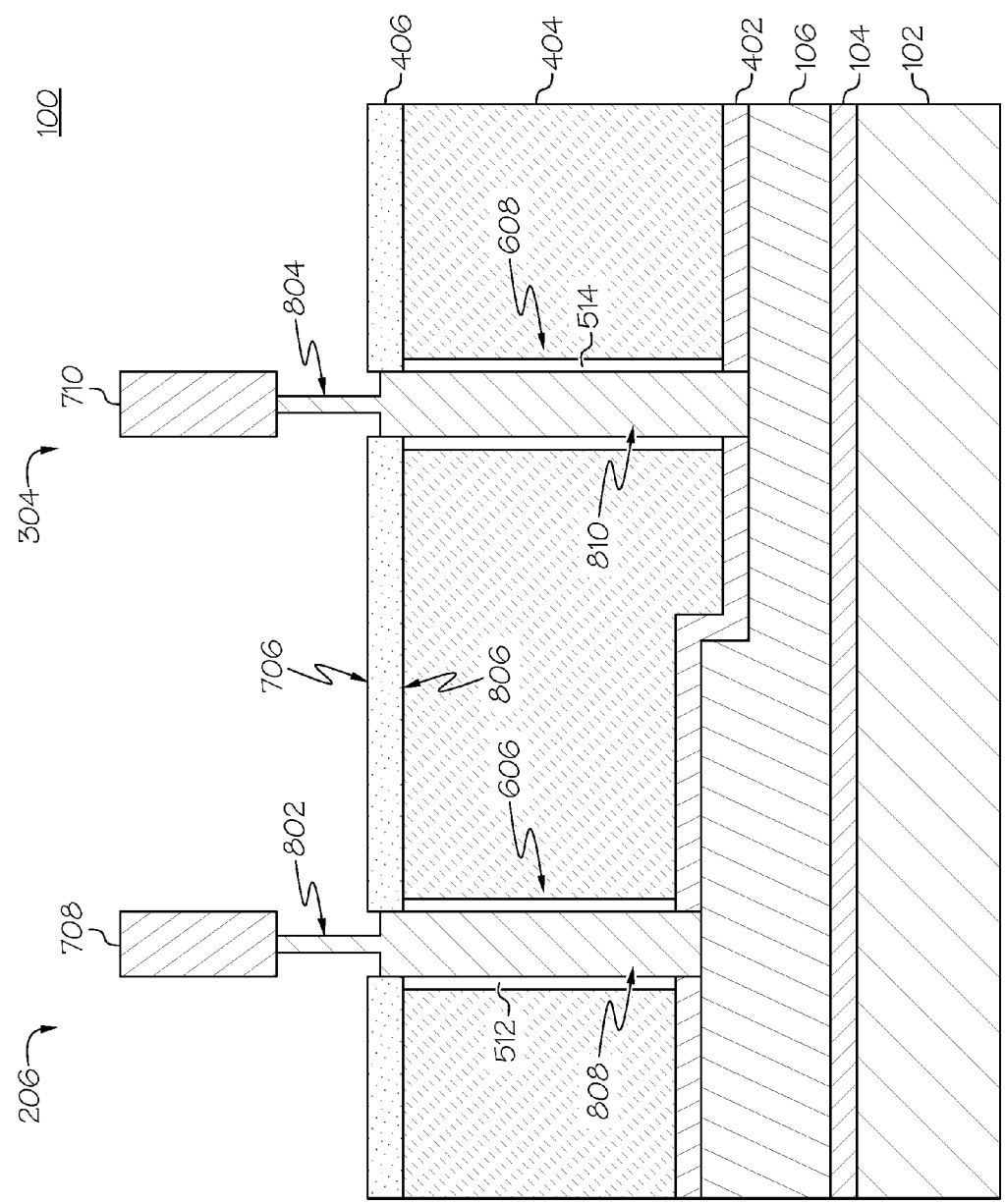
FIG. 8 is a cross-sectional view of the semiconductor structure after a portion of the first and second channel layers have been narrowed according to one embodiment of the present disclosure.

FIG. 8 shows that the dielectric capping layer 408 is removed by, for example, RIE or CMP, stopping on the second spacer layer 406. A lateral etch is then performed to narrow a portion 802, 804 of the channels 606, 608 where drain terminals of the devices are to be formed. The narrowed portions 802, 804 comprise the portions 702, 704 of the channels 606, 608 remaining above the second spacer layer 406 and a portion of the channels 606, 608 extending below the top surface 706 of the second spacer layer 406 and above a bottom surface 806 of the second spacer layer 406. In one embodiment, the narrowed portions 802, 804 of the channels 606, 608 comprise a width of, for example 2 nm to 5 nm while the remaining portions 808, 810 of the channels 606, 608 comprise a width of 4 nm to 10 nm. The lateral etch can be, for example, a wet etch process.

Figure 9:
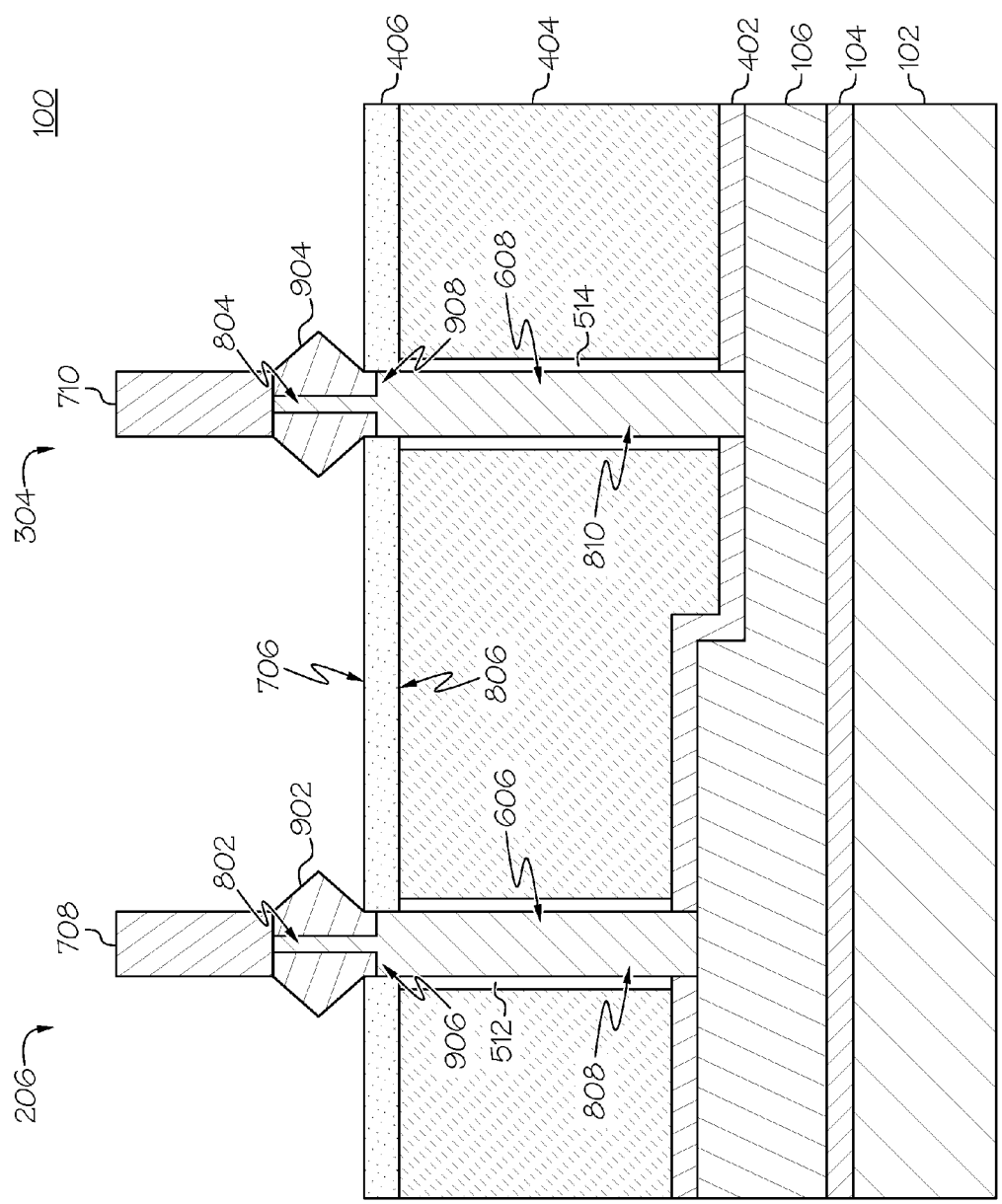
FIG. 9 is a cross-sectional view of the semiconductor structure after drain regions have been formed on the narrowed portions of the first and second channel layers according to one embodiment of the present disclosure.

FIG. 9 shows that a drain 902, 904 is then formed on the narrowed portions 802, 804 of the channels 606, 608 in each of the first and second regions 206, 304 of the structure 100. The drains 902, 904 extend laterally outward from the narrowed portions 802, 804 of the channels 606, 608 beyond the sidewalls of the un-narrowed portions 810, 812 of the channels 606, 608 and down to a top surface 914, 916 of the un-narrowed portions 808, 806. Therefore, a bottom portion 906, 908 of the drains 902, 904 is below the top surface 706 of the second spacer layer 406 and above the bottom surface 806 of the second spacer layer 406.

The drains 902, 904 can be formed using an epitaxy process. For example, epitaxy that is selective with respect to the materials of the mask layers 708, 710 and the second spacer layer 406 is used grow material from the narrowed portions 802, 804 of the channels 606, 608 to form the drains 902, 904. The drains 902, 904 comprise in-situ doping (boron, in one embodiment for pFET and phosphorus, in one embodiment, for nFET). It should be noted that, according to one embodiment, the drains 902, 904 may not contain any doping. In the present embodiment, the doping can be performed using any standard approach such as ion implantation. In particular, the growth rates for (100) vs. (110) oriented planes are engineered so that during the epitaxial growth on (100) Si faceted drains are obtained. As shown in FIG. 9, the drains 902, 904 comprise angled sides rather than completely abutting the gate. It should be noted that, non-faceted (i.e. vertical) epitaxy and/or multiple epitaxy steps can be used to form the drain structure without limiting the scope of the present disclosure.

Figure 10:
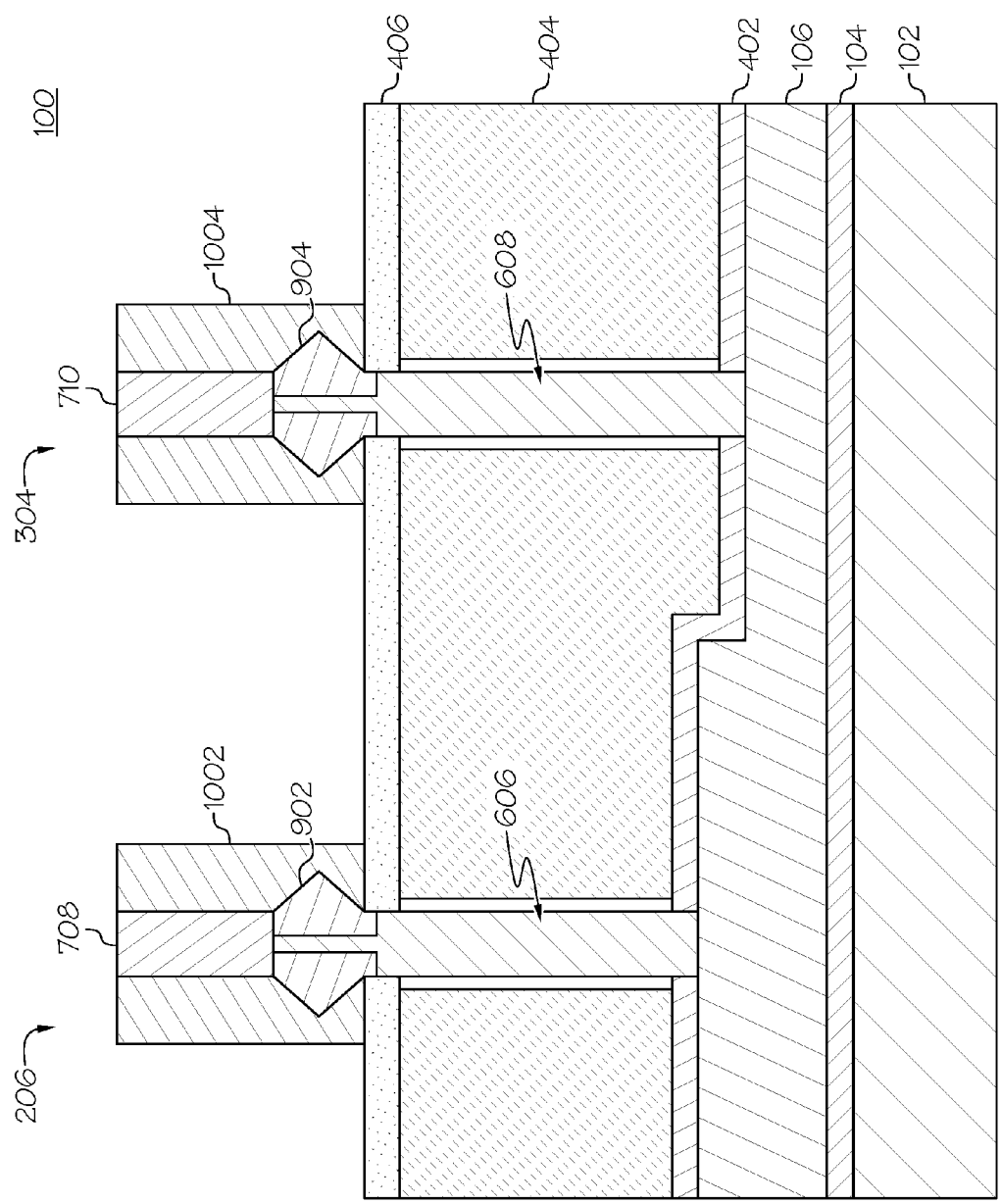
FIG. 10 is a cross-sectional view of the semiconductor structure after spacers have been formed on the drain regions, masks, and top spacer layer of the structure according to one embodiment of the present disclosure.

FIG. 10 shows that sacrificial spacers 1002, 1004 comprising a dielectric material (such as silicon oxide, silicon nitride, silicon oxynitride, or a combination of these) is formed on and in contact with the sidewalls of the mask layers 708, 710, the sidewalls of the drains 902, 904, and the top surface 706 of the second spacer layer 406. The sacrificial spacer 1002, 1004 can extend 2 nm to 10 nm past the edge of the drain epitaxy on each side. The spacers 1002, 1004 extend laterally beyond the drains 902, 904 and are planar with a top surface of the mask layers 708, 710. In the illustrated embodiment, the dielectric material is formed and then reactive-ion etching is used to remove the dielectric material except from the sidewalls of the mask layers 708, 710, the sidewalls of the drains 902, 904, and the top surface 706 of the second spacer layer 406.

Figure 11:
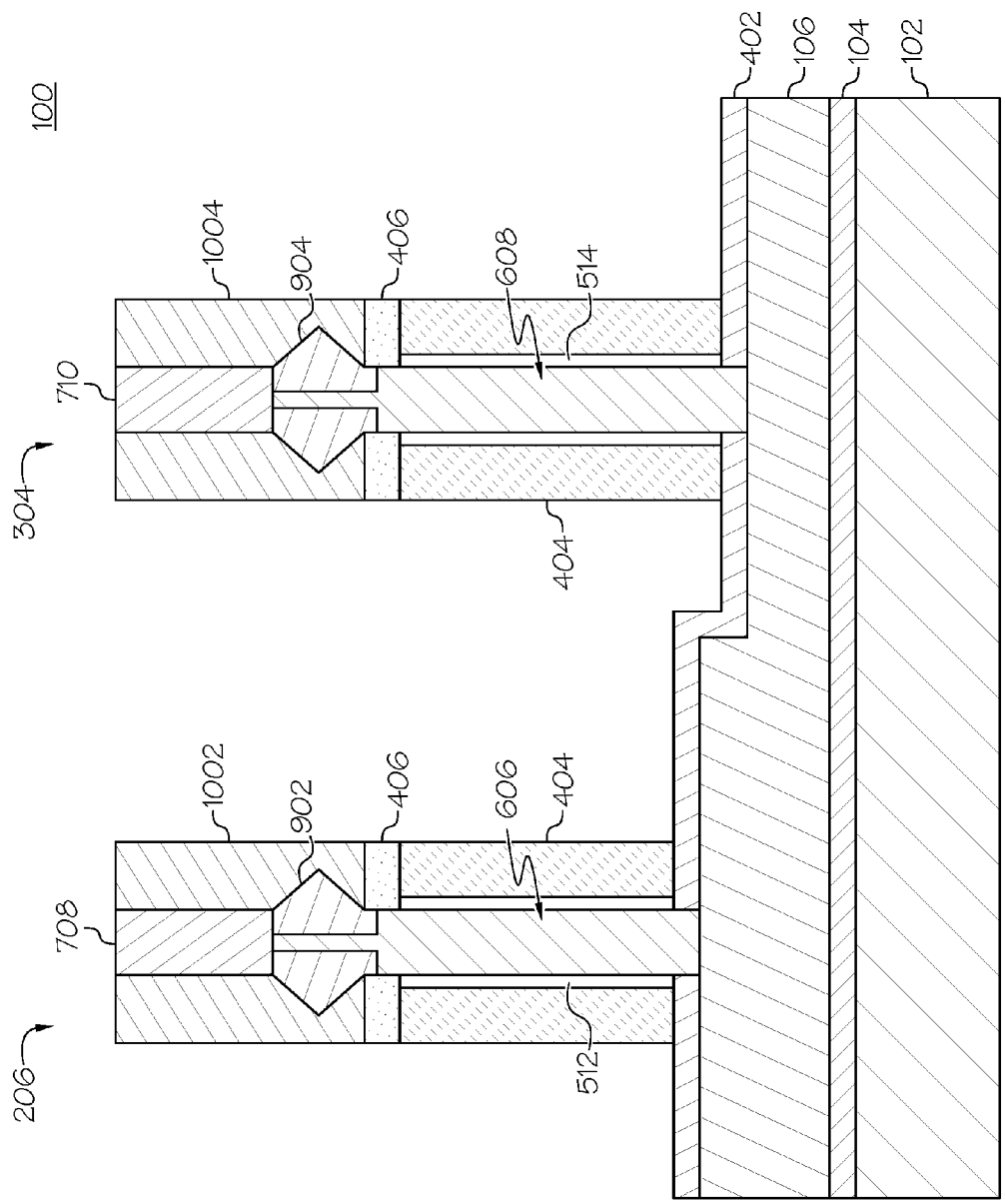
FIG. 11 is a cross-sectional view of the semiconductor structure after portions of the structure not underlying the spacers have been removed down to a bottom spacer layer according to one embodiment of the present disclosure.
Figure 12:
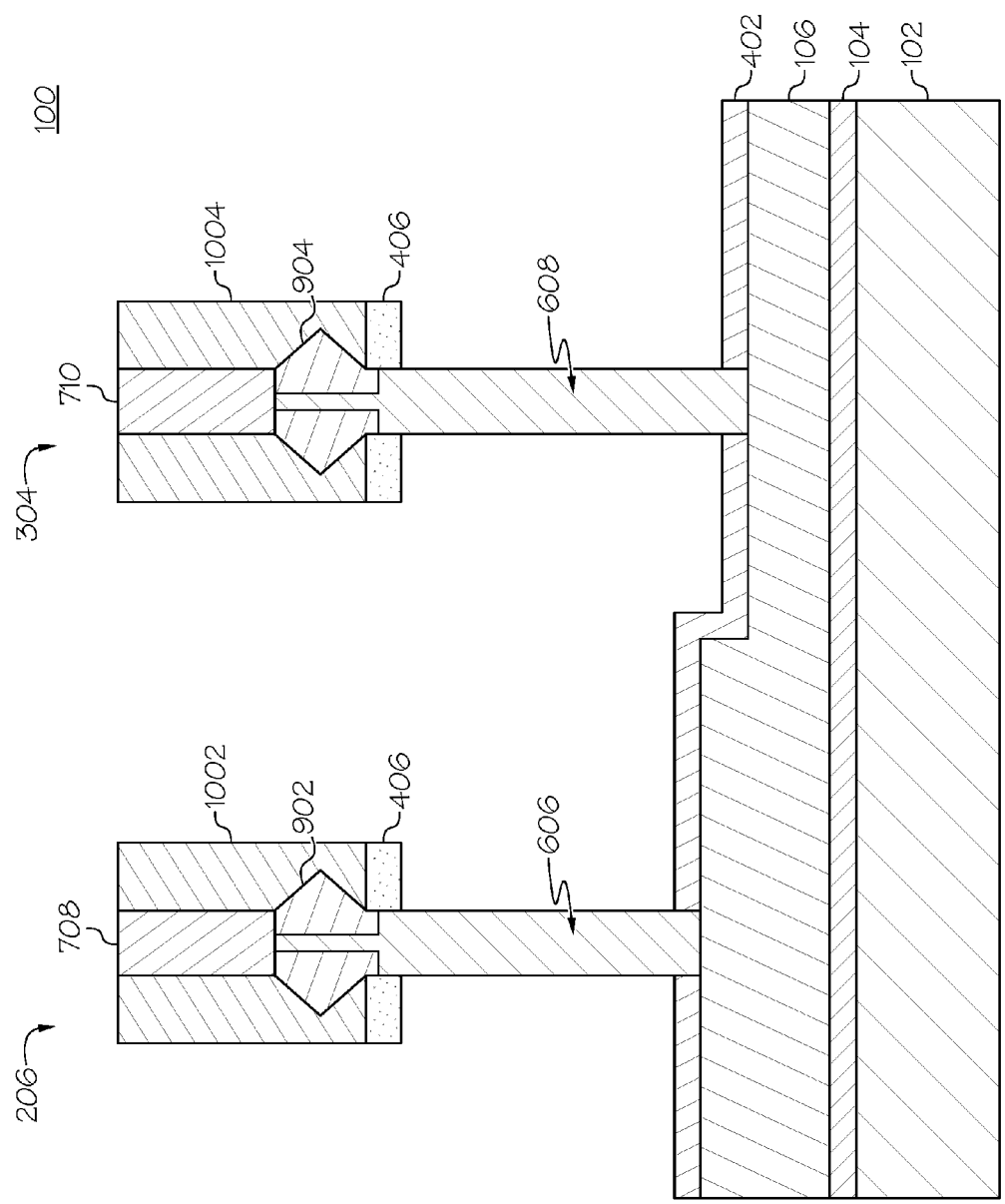
FIG. 12 is a cross-sectional view of the semiconductor structure after a replacement gate has been removed exposing portions of the first and second channel layers according to one embodiment of the present disclosure.

Portions of the second spacer layer 406 and portions of the replacement gate 404 not underlying the sacrificial spacers 1002, 1004 are then removed, as shown in FIG. 11. For example, a first etching process such as RIE is performed to etch portions of the replacement gate 404 not underlying the sacrificial spacers 1002, 1004 selective to the replacement gate 404. Then, a second etching process such as RIE is then performed to etch portions of the replacement gate 404 not underlying the sacrificial spacers 1002, 1004 selective to the first spacer layer 402. Portions of the replacement gate 404 underlying the sacrificial spacers 1002, 1004 and the protective layers 402, 704 are then removed exposing the channels 606, 608, as shown in FIG. 12. The portions of the replacement gate 404 underlying the sacrificial spacers 1002, 1004 and the protective layers 512, 514 can be removed by selective etching or another technique.

Figure 13:
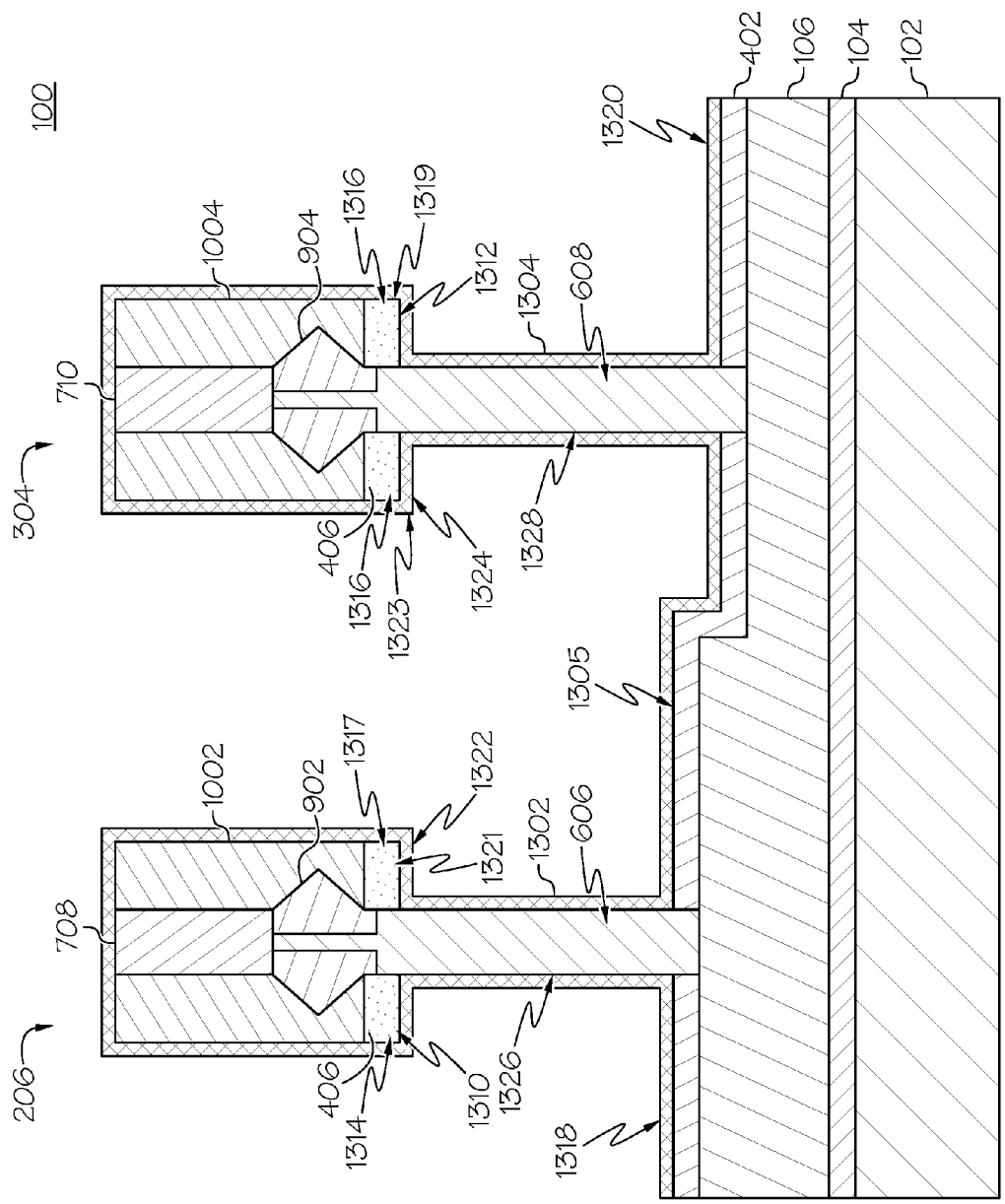
FIG. 13 is a cross-sectional view of the semiconductor structure after a dielectric layer has been formed on the exposed portions of the first and second channel layers according to one embodiment of the present disclosure.

Once the replacement gate 404 and protective layers 402, 704 have been removed, an RMG process is performed. For example, a high-k dielectric material is blanket deposited over the entire structure 100, for example by CVD (chemical vapor deposition), PECVD (plasma enhanced chemical vapor deposition), or ALD (Atomic layer deposition), as shown in FIG. 13. The high-k gate material forms a high-k dielectric layer 1302, 1304 on, in contact with, and conforming to sidewalls of the spacer layers 1002, 1004, a top surface of the mask layers 708, 710, a top surface 1305 of the first spacer layer 402, sidewalls of the channels 606, 608, a bottom surface 1310, 1312 of portions 1314, 1316 of the second spacer layer 406 underlying the sacrificial spacers 1002, 1004, and sidewalls 1317, 1319 of the portions 1314, 1316 of the second spacer layer 406. In one embodiment, the high-k dielectric layer 1302, 1304 is a continuous layer formed over both structures within the first and second regions 206, 304. The high-K gate dielectric layer 1302, 1304 can have a thickness between 0.1 nm and 3 nm.

In one embodiment, the portions 1318, 1320 of the high-k gate dielectric layer 1302, 1304 conforming to the first spacer layer 402 are substantially parallel to the portions 1322, 1324 of the high-k gate dielectric layer 1302, 1304 conforming to the 1310, 1312 of portions 1314, 1316 of the second spacer layer 406. The portions 1326, 1328 of the high-k gate dielectric layers 1302, 1304 conforming to the sidewalls of the channels 606, 608 are substantially perpendicular to portions 1318, 1320, 1322, 1324 of the high-k gate dielectric layer, 1302, 1304. The portions 1326, 1328 of the high-k gate dielectric layers 1302, 1304 conforming to the sidewalls of the channels 606, 608 are also parallel to portions 1321, 1323 of the high-k gate dielectric layers 1302, 1304 conforming to the sidewalls 1317, 1319 of the second spacer layer 406. This configuration of the high-k gate dielectric layer 1302, 1304, in one embodiment, forms a C or rotated U shape.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

Figure 14:
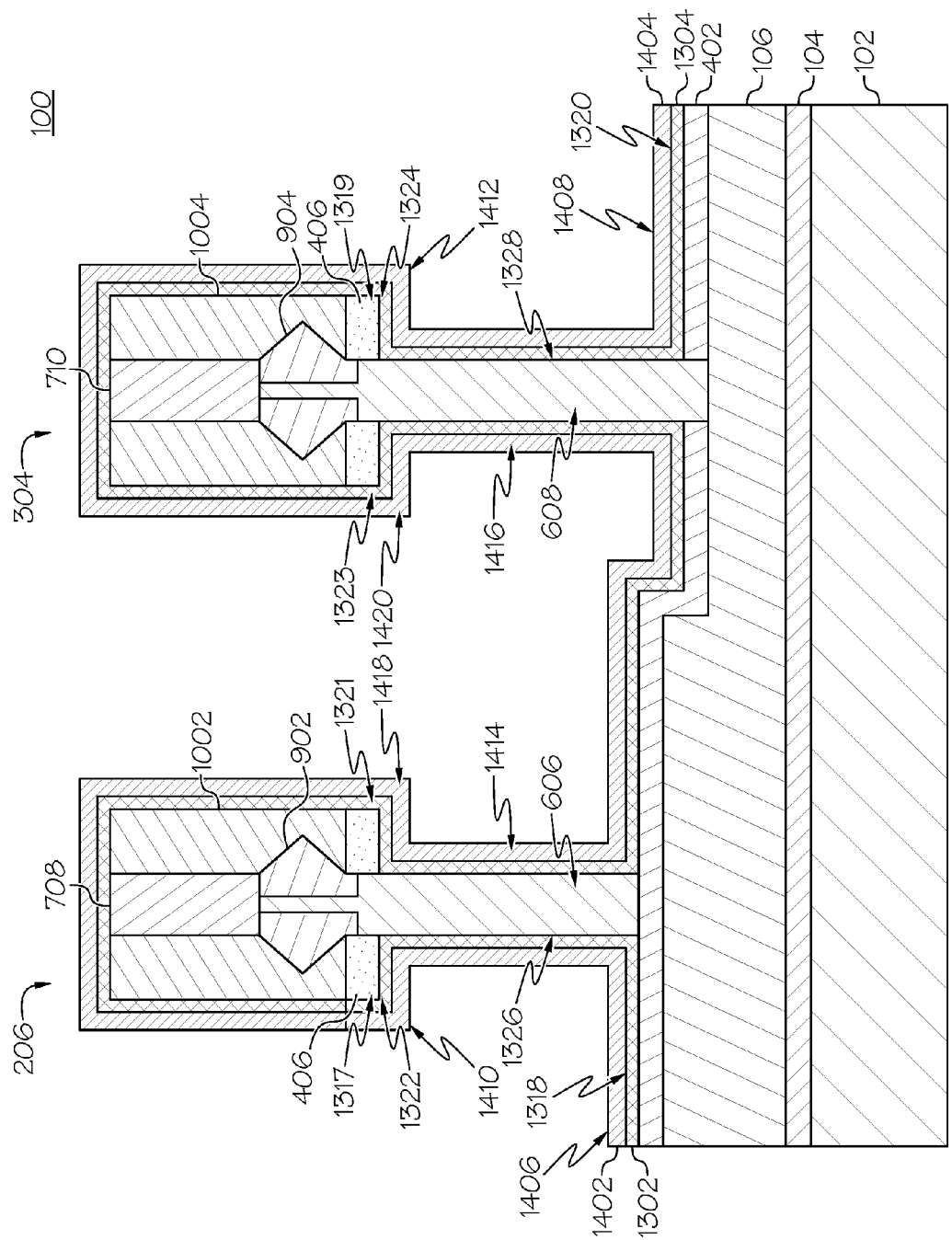
FIG. 14 is a cross-sectional view of the semiconductor structure after metal gate layers have been formed conforming to dielectric layers according to one embodiment of the present disclosure.

FIG. 14 shows that one or more conductive materials are deposited over the entire structure 100 to form metal gates 1402, 1404 conforming to and in contact with the high-k gate dielectric layers 1302, 1304. The metal gates 1402, 1404 comprise a configuration similar to that of the high-k gate dielectric layers 1302, 1304 discussed above with respect to FIG. 13. For example, portions of the metal gates 1402, 1404 are formed on and in contact with the portions of the high-k dielectric layer 1302, 1304 contacting the sidewalls of the spacer layers 1002, 1004 and the top surface of the mask layers 708, 710. Portions 1406, 1408 of the metal gates 1402, 1404 conforming to portions 1318, 1320 of the high-k gate dielectric layer 1302, 1304 are substantially parallel to the portions 1410,1412 of the of the metal gates 1402, 1404 conforming to portions 1322, 1324 of the high-k gate dielectric layer 1302, 1304. Portions 1414, 1416 of the metal gates 1402, 1404 conforming to portions 1326, 1328 of the high-k gate dielectric layers 1302, 1304 are substantially perpendicular to portions 1406, 1408, 1410, 1412 of the metal gates 1402, 1404. Also, portions 1414, 1416 are parallel to portions 1418, 1420 of the metal gates 1402, 1404 conforming to portions 1321, 1323 of the high-k gate dielectric layers 1302, 1304.

In one embodiment, the conductive material comprises polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. The conductive material may comprises multiple layers such as gate workfunction setting layer (work function metal) and gate conductive layer.

Figure 15:
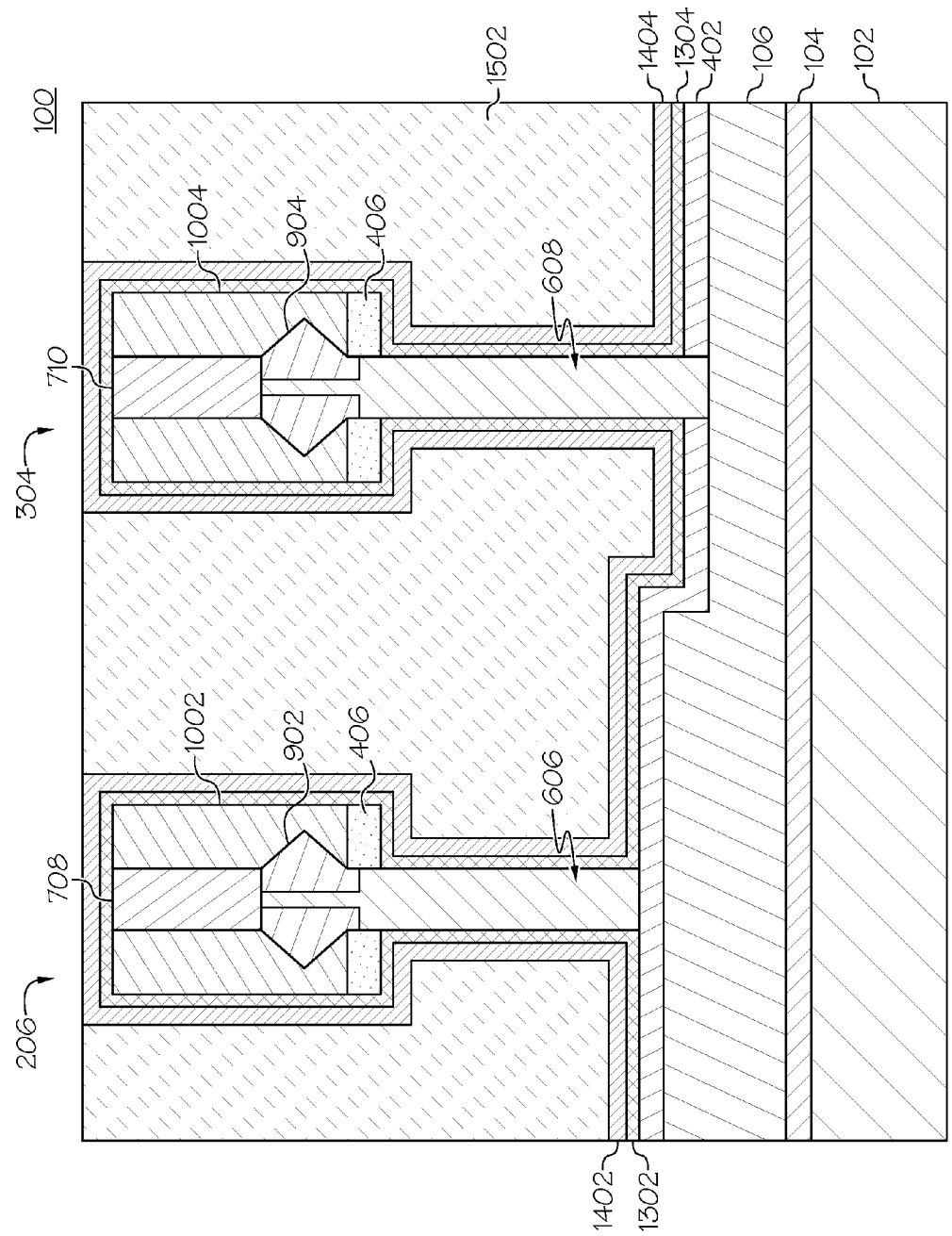
FIG. 15 is a cross-sectional view of the semiconductor structure after a metal gate fill has been deposited over the structure according to one embodiment of the present disclosure.
Figure 16:
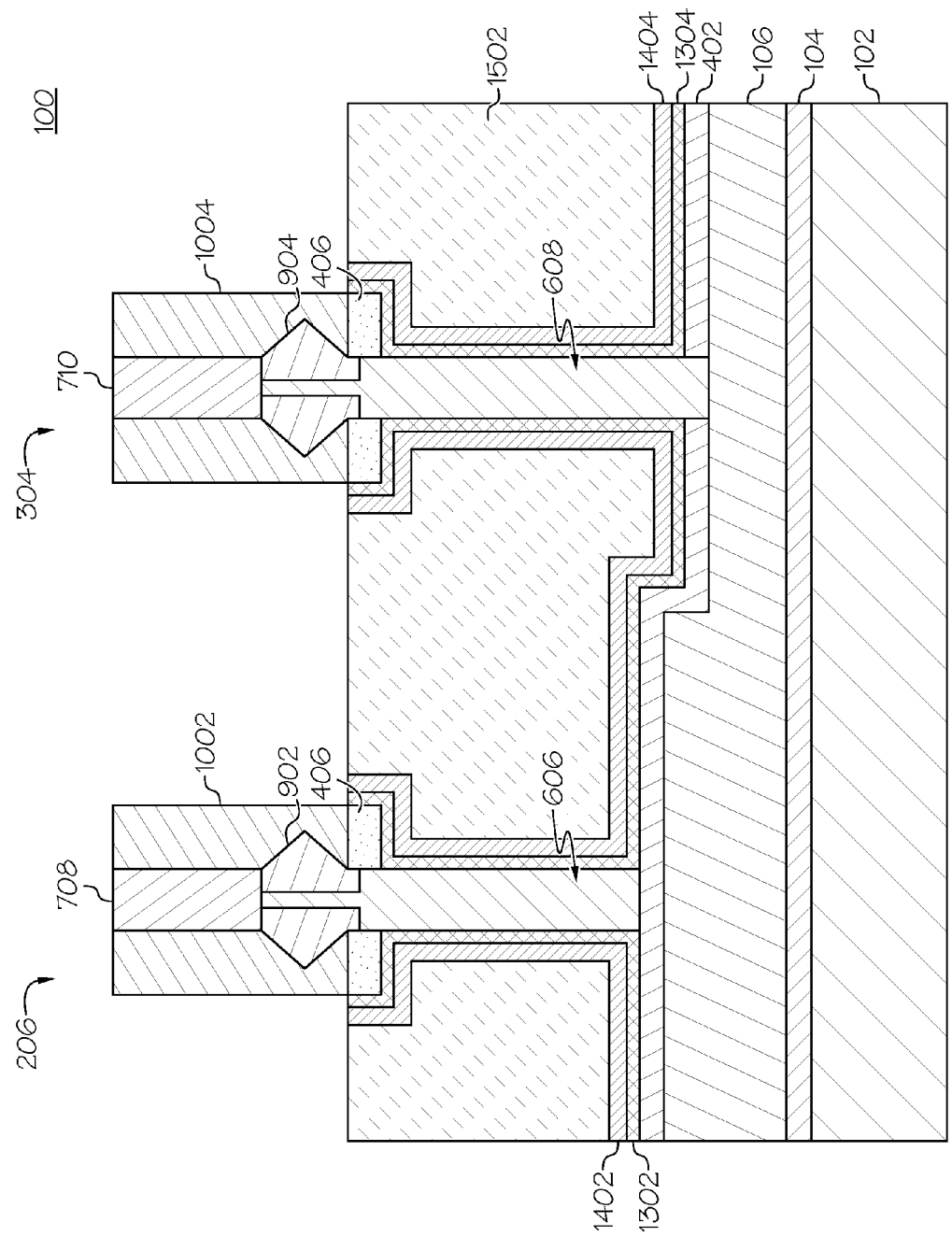
FIG. 16 is a cross-sectional view of the semiconductor structure after the metal gate fill has been recessed according to one embodiment of the present disclosure.

FIG. 15 shows that a gate fill material layer 1502 is blanket deposited over the structure 100 shown in FIG. 14. The gate fill material layer 1502 can be, for example, tungsten or aluminum. The gate fill material layer 1502 is then polished using, for example, CMP. For example, FIG. 16 shows that the gate fill material layer 1502 has been polished down to a top surface 706 of the second spacer layer 406. FIG. 16 also shows that a subsequent polishing or etching process is performed to remove portions of the metal gates 1402, 1404 and corresponding high-k dielectric layer 1302, 1304 that are above the top surface 706 of the second spacer layer 406.

Figure 17:
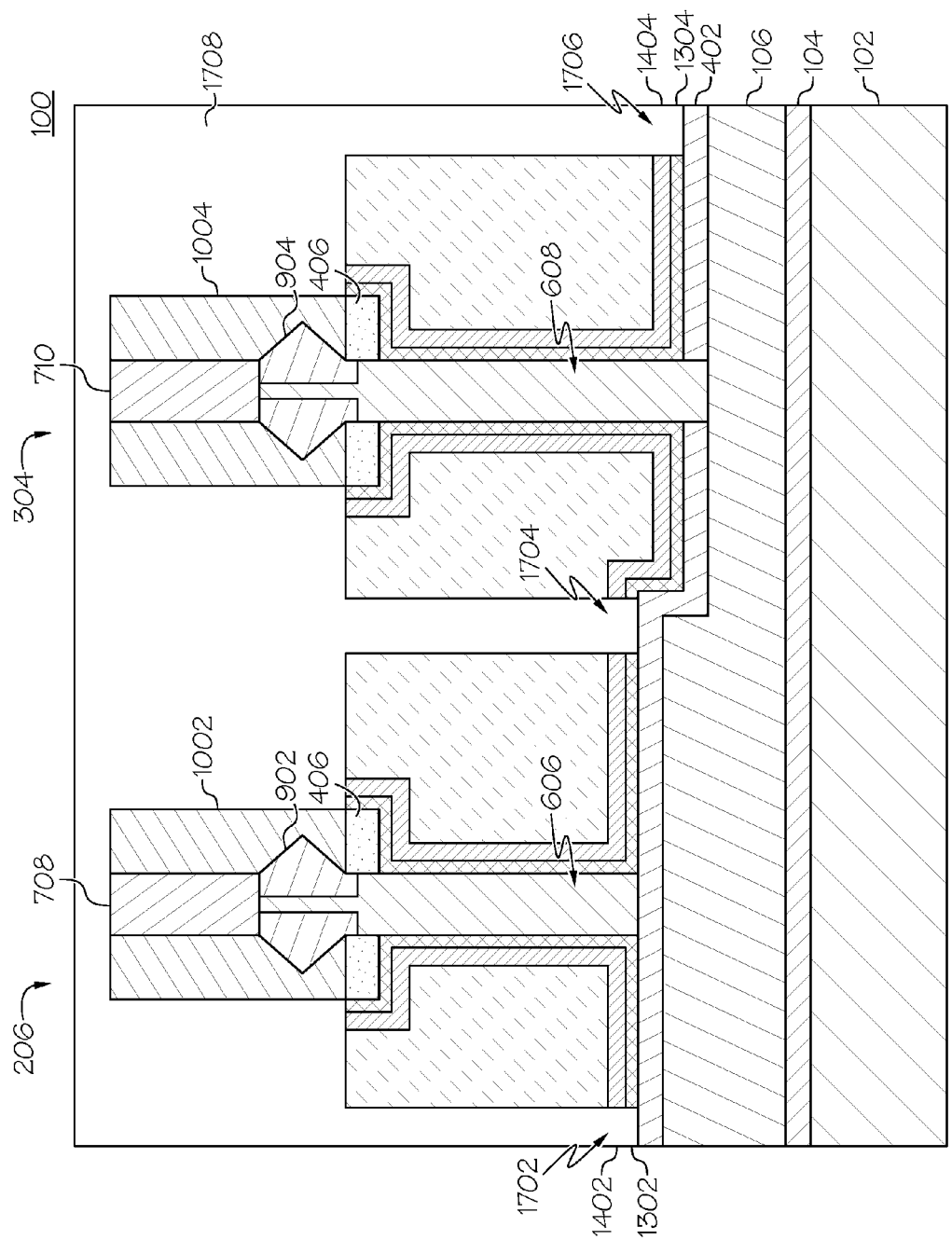
FIG. 17 is a cross-sectional view of the semiconductor structure after the recessed metal gate fill has been patterned according to one embodiment of the present disclosure.
Figure 18:
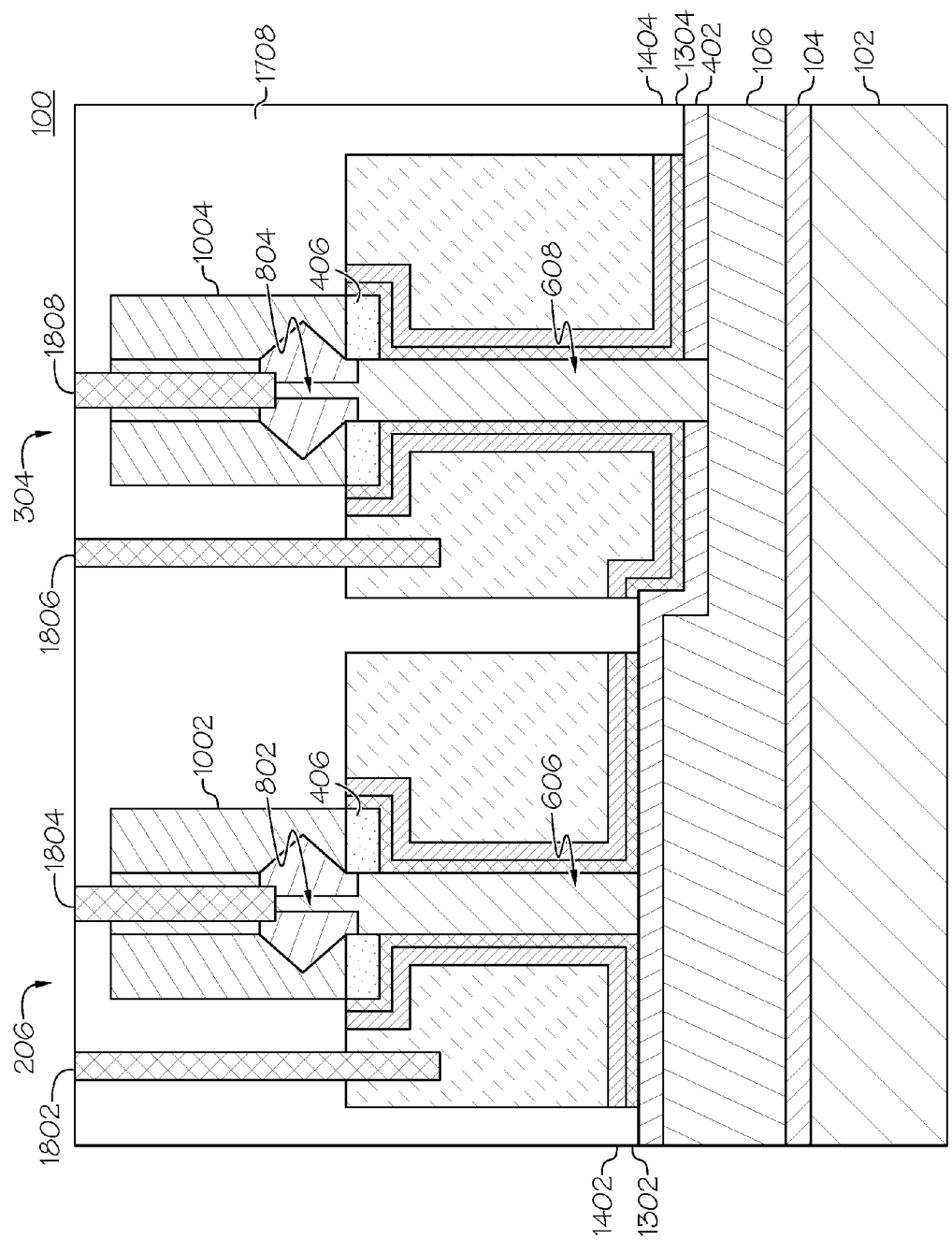
FIG. 18 is a cross-sectional view of the semiconductor structure after a dielectric material has been deposited over the structure and contacts have been formed according to one embodiment of the present disclosure.

Lithography and etching processes are used to pattern the recessed gate fill material layer 1502. For example, FIG. 17 shows that areas of the recessed portions of the recessed gate fill material layer 1502 have been removed exposing portions 1702, 1704, 1706 of the bottom spacer layer 402 on each side of the devices in the first and second regions 206, 304. FIG. 17 also shows that an inter-layer dielectric material 1708 has been formed over the entire structure 100. The fabrication process is then continued to form contacts for the devices in the first and second regions 206, 304. For example, FIG. 18 shows that lithography and etching processes are performed to create contact trenches within the dielectric material 1708 and down into (below a top surface) the recessed gate fill material layer 1502 on at least one side of the devices within the first and second regions 206, 304. This lithography and etching processes also form a trench within the hardmasks 708, 710 between the spacers 1002, 1004 to create contact trenches exposing at least a top surface of the drains 902, 904 and the narrowed portions 802, 804 of the channels 606, 608. A metallization process is then performed to create contacts 1802, 1804, 1806, 1808 in the contact trenches. The metallization can involve CVD, PVD, ALD, or electroplating processes or some combination of these processes.

Figure 19:
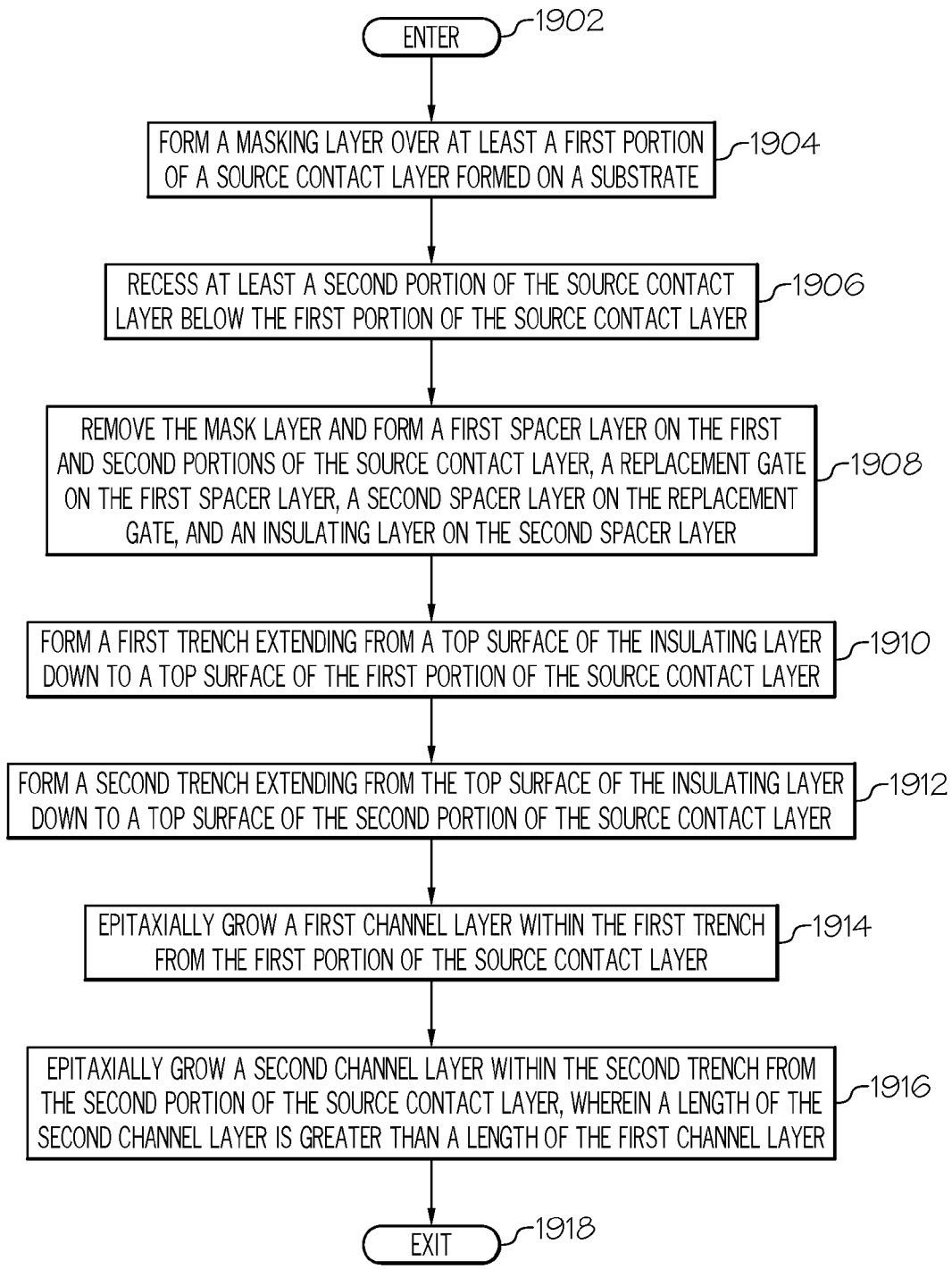
FIG. 19 is an operational flow diagram illustrating one process for fabricating a semiconductor structure comprising a plurality of vertical transistors each having different gate lengths according to one embodiment of the present disclosure.

FIG. 19 is an operational flow diagram illustrating one process for fabricating a semiconductor structure comprising a plurality of vertical transistors each having different gate lengths according to one embodiment of the present disclosure. In FIG. 19, the operational flow diagram begins at step 1902 and flows directly to step 1904. It should be noted that each of the steps shown in FIG. 19 has been discussed in greater detail above with respect to FIGS. 1-18. A masking layer, at step 1904, is formed over at least a first portion of a source contact layer formed on a substrate. At least a second portion of the source contact layer, at step 1206, is recessed below the first portion of the source contact layer.

The mask layer is removed and a first spacer layer on the first and second portions of the source contact layer, a replacement gate on the first spacer layer, a second spacer layer on the replacement gate, and an insulating layer on the second spacer layer, are formed on the first and second portions of the source contact layer, at step 1908. A first trench, at step 1910, is formed that extends from a top surface of the insulating layer down to a top surface of the first portion of the source contact layer. A second trench, at step 1912, is formed that extends from a top surface of the insulating layer down to a top surface of the second portion of the source contact layer. A first channel layer, at step 1914, is epitaxially grown within the first trench from the first portion of the source contact layer. A second channel layer, at step 1916, is epitaxially grown within the second trench from the second portion of the source contact layer, where a length of the second channel layer is greater than a length of the first channel layer. Additional fabrication processes such as metal gate and contact formation can then be performed. The control flow exits at step 1918.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for fabricating a semiconductor structure comprising a plurality of vertical transistors each having different gate lengths, the method comprising:
   form a masking layer over at least a first portion of a source contact layer formed on a substrate;
   recessing at least a second portion of the source contact layer below the first portion of the source contact layer;
   removing the masking layer and forming a first spacer layer on the first and second portions of the source contact layer, a replacement gate on the first spacer layer, a second spacer layer on the replacement gate, and an insulating layer on the second spacer layer;
   forming a first trench extending from a top surface of the insulating layer down to a top surface of the first portion of the source contact layer;
   forming a second trench extending from the top surface of the insulating layer down to a top surface of the second portion of the source contact layer;
   epitaxially growing a first channel layer within the first trench from the first portion of the source contact layer; and
   epitaxially growing a second channel layer within the second trench from the second portion of the source contact layer, wherein a length of the second channel layer is greater than a length of the first channel layer.

2. The method of claim 1, further comprising:
forming a counter-doped layer between the substrate and the source contact layer.

3. The method of claim 1, further comprising:
prior to epitaxially growing the first channel layer, forming a protective layer on exposed portions of the replacement gate within the first trench; and
prior to epitaxially growing the second channel layer, forming a protective layer on exposed portions of the replacement gate within the second trench.

4. The method of claim 1, further comprising:
recessing the first and second channel layers, the recessing leaving a first portion of the first and second channel layers above the second spacer layer;
after the recessing, forming a first mask above and in contact with the first channel layer and forming a second mask above and in contact with second channel layer;
after forming the first and second masks, removing the insulating layer exposing the first portion of the first and second channel layers; and
performing a lateral etch of the first portion of the first and second channel layers, the lateral etch narrowing the first portion of the first and second channel layers and a second portion of the first and second channel layers below a top surface of the second spacer layer.

5. The method of claim 4, further comprising:
forming a first drain region and second drain region on the first and second portions of the first and second channel layers, respectively.

6. The method of claim 5, further comprising:
forming a third spacer layer on and in contact with sidewalls of the first mask and sidewalls of the first drain region, the third spacer layer also being formed on and in contact with a top surface of the second spacer layer in a first region corresponding to the first portion of the structure; and
forming a fourth spacer layer on sidewalls of the second mask and sidewalls of the second drain region, the fourth spacer layer also being formed on and in contact with a top surface of the second spacer layer in a second region corresponding to the second portion of the structure.

7. The method of claim 6, further comprising:
removing portions of the structure not underlying the third and fourth spacer layers down to the first spacer layer.

8. The method of claim 7, further comprising:
removing a portion of the replacement gate under the third spacer layer and a portion of the replacement gate under the fourth spacer layer, the removing exposing sidewalls of the first channel layer and the second channel layer.

9. The method of claim 8, further comprising:
forming a first metal gate structure on and in contact with the exposed sidewalls of the first channel layer, a portion of the first spacer layer under the third spacer layer, and a portion of the second spacer layer under the third spacer layer; and
forming a second metal gate structure on and in contact with the exposed sidewalls of the second channel layer, a portion of the first spacer layer under the fourth spacer layer, and a portion of the second spacer layer under the fourth spacer layer.

10. The method of claim 9, wherein forming each of the first and second metal gate structure comprises:
forming a first dielectric layer on and in contact with the exposed sidewalls of the first channel layer, the portion of the first spacer layer under the third spacer layer, and the portion of the second spacer layer under the third spacer layer; and
forming a second dielectric layer on and in contact with the exposed sidewalls of the second channel layer, the portion of the first spacer layer under the fourth spacer layer, and the portion of the second spacer layer under the fourth spacer layer.

11. The method of claim 10, wherein forming each of the first and second metal gate structure further comprises:
forming a first metal layer in contact with and conforming to the first dielectric layer; and
forming a second metal layer in contact with and conforming to the second dielectric layer.

12. The method of claim 9, further comprising:
forming recessed metal gate fill layers on each side of the first and second metal gate structures;
depositing a dielectric layer over the first and second regions of the structure;
forming a first contact trench through the dielectric layer exposing at least a top surface of the recessed metal gate fill layer on at least a first side of the first metal gate structure;
forming a second contact trench through the dielectric layer exposing at least a top surface of the recessed metal gate fill layer on at least a first side of the second metal gate structure;
forming a third contact trench exposing a top surface of the first drain region and a top surface of the first portion of the first channel layer;
forming a fourth contact trench exposing a top surface of the second drain region and a top surface of the first portion of the second channel layer; and
forming a contact in each of the first, second, third, and fourth contact trenches.

* * * * *